(12) United States Patent
Hofmann

(10) Patent No.: US 6,469,335 B2
(45) Date of Patent: Oct. 22, 2002

(54) SEMICONDUCTOR MEMORY HAVING A MEMORY CELL ARRAY

(75) Inventor: Franz Hofmann, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/820,234

(22) Filed: Mar. 28, 2001

(65) Prior Publication Data

US 2001/0032991 A1 Oct. 25, 2001

(30) Foreign Application Priority Data

Mar. 28, 2000 (DE) ......................................... 100 15 278

(51) Int. Cl.$^7$ ............................................. H01L 27/108
(52) U.S. Cl. ........................................ 257/296; 257/347
(58) Field of Search .................... 257/296, 301–311, 257/347, 350, 351

(56) References Cited

U.S. PATENT DOCUMENTS

| | | | |
|---|---|---|---|
| 4,443,868 A | | 4/1984 | Takemae |
| 4,791,610 A | * | 12/1988 | Takemae |
| 4,807,195 A | | 2/1989 | Busch et al. |
| 5,834,805 A | | 11/1998 | Tang |
| 5,867,420 A | | 2/1999 | Alsmeier |
| 5,952,701 A | * | 9/1999 | Bulucca et al. |
| 5,953,246 A | * | 9/1999 | Takashima et al. |
| 5,998,807 A | * | 12/1999 | Lustig et al. |
| 6,238,961 B1 | * | 5/2001 | Asano et al. |
| 6,358,820 B1 | * | 3/2002 | Maeda |

FOREIGN PATENT DOCUMENTS

| | | | |
|---|---|---|---|
| EP | 0240155 | * | 10/1987 |
| WO | WO 96/12301 | | 4/1996 |

OTHER PUBLICATIONS

Streetman, "Solid State Electronic Devices," 1990, Prentice–Hall, 3$^{rd}$ edition, p. 349–350.*
Wolf, "Silicon Processing for the VLSI Era, vol. 2—Process Integration," 1990, Lattice Press, vol. 2, p. 609–612.*
Thomas Skotnicki: "Advanced Architectures For 0.18–0.12βm CMOS Generations", ESSDERC1996, pp. 505–514.

* cited by examiner

Primary Examiner—Nathan J. Flynn
Assistant Examiner—Kevin Quinto
(74) Attorney, Agent, or Firm—Laurence A. Greenberg; Werner H. Stemer; Ralph E. Locher

(57) ABSTRACT

A semiconductor memory such as, for example, a DRAM (Dynamic Random Access Memory) includes a memory cell array and an addressing periphery. A first memory cell having a first selection transistor and a first storage capacitor, and a second memory cell having a second selection transistor and a second storage capacitor are configured in the memory cell array. The first selection transistor is designed as an n-channel transistor and the second selection transistor is designed as a p-channel transistor. This makes it possible to realize a folded bit line concept for memory cells which are smaller than $8F^2$.

14 Claims, 16 Drawing Sheets

Bn-Bn

A-A

Bp-Bp

Bn-Bn

Bp-Bp

Dn-Dn

Dn-Dn

C-C

SEMICONDUCTOR MEMORY HAVING A MEMORY CELL ARRAY

BACKGROUND OF THE INVENTION

Field of the Invention

The present invention relates to a semiconductor memory which has memory cells having capacitors and transistors.

Memories are used to store information in data processing systems. In this case, DRAM (Dynamic Random Access Memory) memories, for example, are used, which usually include a memory cell array and an addressing periphery with logic switching elements. Memory cells including a storage capacitor and a selection transistor are configured in the memory cell array. In this case, the gate of the selection transistor is connected to a word line, the source doping region is connected to the storage capacitor and the drain doping region is connected to a bit line. Application of suitable control voltages to the gate controls the selection transistor in such a way that a current flow between the source and drain regions through the channel of the selection transistor is switched on and off.

Further bit lines are usually configured beside the bit line. The "folded bit line" circuit concept uses two adjacent bit lines which are connected to two inputs of a sense amplifier. In this case, the sense amplifier is usually two interconnected inverters which compare the two adjacent bit lines with one another and evaluate them. The word line runs transversely with respect to the two bit lines and a selection transistor opens when a suitable control voltage is applied to the word line, as a result of which, the charge stored in the storage capacitor flows onto the first bit line. There is no selection transistor configured at the crossover point between the word line and the second bit line and the word line here is referred to as a passing word line. The second bit line serves merely as a reference for the first bit line onto which the charge of the storage capacitor flows. For an adjacent word line, the two bit lines exchange roles, in this case the first bit line serving as an evaluation reference for the memory cell connected to the second bit line. This evaluation principle is very widespread, is used because of its robustness and is described in U.S. Pat. No. 4,443,868 and U.S. Pat. No. 4,807,195. A DRAM memory cell is specified, for example, in U.S. Pat. No. 5,867,420.

Because of the geometrical configuration of the word line and the bit line, which are both dimensioned with the smallest feature size F, the size of a memory cell is always greater than or equal to $8F^2$.

SUMMARY OF THE INVENTION

It is accordingly an object of the invention to provide a semiconductor memory which overcomes the above-mentioned disadvantageous of the prior art apparatus and methods of this general type, and which in particular, has a memory cell size of less than $8F^2$.

With the foregoing and other objects in view there is provided, in accordance with the invention, a semiconductor memory having a memory cell array. The memory cell array includes: a silicon on insulator substrate having an insulation layer; a first memory cell having a first storage capacitor and a first selection transistor formed as an n-channel transistor; and a second memory cell having a second storage capacitor and a second selection transistor formed as a p-channel transistor. The first memory cell and the second memory cell are formed in the silicon on insulator substrate.

The configuration specified uses both n- and p-channel transistors in the memory cell array. In this case, for example, it is provided that one bit line is connected to n-channel transistors and the adjacent bit line is connected to p-channel transistors. The n-channel transistors have the property of turning off for low voltages at the gate and turning on for high voltages. This means that the bit line with the n-channel transistors is active when a high voltage is applied to the word line. In contrast to this, the bit line with the p-channel transistors exhibits an opposite behavior. In this case, the p-channel transistors turn off for a high gate voltage and turn on for a low gate voltage. If a sense amplifier is connected to the bit line with the n-channel transistors and to the bit line with the p-channel transistors and a high word line voltage is applied, then the n-channel transistor opens and the p-channel transistor turns off, with the result that the memory cell—to be read—with the n-channel transistor can be read and the bit line with the p-channel transistors can be used as a reference.

In accordance with an added feature of the invention, at least one of the storage capacitors is a trench capacitor. The design of a storage capacitor as a trench capacitor has the advantage that the storage capacitor can be made in a space-saving manner with a large capacitance. Furthermore, the methods which are usually known for forming trench capacitors can be used.

In accordance with an additional feature of the invention, at least one of the storage capacitors is a stacked capacitor. Stacked capacitors constitute a further possibility for producing the storage capacitor with a large capacitance in a space-saving configuration.

In accordance with another feature of the invention, a trench isolation and the insulation layer insulate the first selection transistor from the second selection transistor. This enables the compact configuration of p-channel transistors and n-channel transistors.

In accordance with an a further feature of the invention, the first selection transistor or the second selection transistor is formed as a vertical transistor. This enables a further compact design for the memory cells and the memory cell array, which enables a memory size of just $4F^2$.

In accordance with a further added feature of the invention, a first bit line is connected to the first memory cell and a second bit line is connected to the second memory cell, and the first bit line and the second bit line are connected to a sense amplifier. Connecting a sense amplifier to the first bit line, which is connected to n-channel transistors, and to the second bit line, which is connected to p-channel transistors, advantageously enables the "folded bit line" concept for memory cell sizes of less than $8F^2$.

In accordance with a further additional feature of the invention, the first selection transistor has a gate made of a mid-gap material which is chosen such that the threshold voltage of the first selection transistor is the negative threshold voltage of the second selection transistor. This enables a symmetrical threshold voltage about the voltage zero for the n-channel transistor and the p-channel transistor.

In accordance with another further feature of the invention, the first selection transistor and the second selection transistor turn off for a first word line voltage. The advantage here is that both the first storage capacitor and the second storage capacitor retain the charge stored in them, since both transistors turn off.

In accordance with another added feature of the invention, the first selection transistor opens for a second word line voltage, which is greater than the first word line voltage. This procedure makes it possible to open the first selection transistor in order to read out the information stored in the first memory cell.

In accordance with another additional feature of the invention, the second selection transistor opens for a third word line voltage, which is less than the first word line voltage. The third word line voltage makes it possible to read out the information stored in the second memory cell.

In accordance with yet an added feature of the invention, polysilicon doped with dopant is used as a gate material for the first selection transistor and/or for the second selection transistor. The threshold voltage of the first selection transistor and of the second selection transistor can be set by way of the doping of the polysilicon. The effect that can thereby be achieved is, for example, that both the first selection transistor and the second selection transistor turn off for the first word line voltage.

In accordance with yet an additional feature of the invention, germanium is used as a dopant. Using germanium as the dopant, it is possible to set the threshold voltages of p- and n-channel transistors symmetrically with respect to zero. This is advantageous, for example, if a symmetrical operating voltage is to be used.

In accordance with yet another feature of the invention, the gate material for the first selection transistor and/or for the second selection transistor contains titanium nitride, tungsten or tantalum. These materials likewise allow the setting of the threshold voltages of p- and n-channel transistors symmetrically with respect to zero.

In accordance with yet a further feature of the invention, a silicide is used for connecting the first storage capacitor to a first source doping region of the first selection transistor and/or for connecting the second storage capacitor to a second source doping region of the second selection transistor. Since one source doping region is p-doped and the other source doping region is n-doped, a silicide can be used for connecting both doping regions without forming a pn junction, which would have a blocking effect for a voltage constellation.

In accordance with yet a further added feature of the invention, the first memory cell is formed on an SOI substrate. An SOI substrate advantageously enables the configuration of p-channel transistors and n-channel transistors in direct proximity. Without an SOI substrate, the p-channel transistors and n-channel transistors are usually insulated from one another by reverse-biased pn junctions. Since this takes up a great deal of space, the use of an SOI substrate in which an insulating silicon oxide layer can be used for insulating n-channel transistors and p-channel transistors means that an enormous amount of space is saved.

In accordance with yet a further additional feature of the invention, the first memory cell and the second memory cell are insulated from one another by a trench isolation. The use of a trench isolation, also called STI (Shallow Trench Isolation), enables a further space saving, since adjacent transistors and doping regions can be insulated from one another.

In accordance with a concomitant feature of the invention, a conductive layer is configured between the trench isolation and an insulation layer of the SOI substrate. Usually, the channel region of transistors which are formed on an SOI substrate is not connected since the bulk contact is prevented by the insulation layer of the SOI substrate. By providing a conductive layer between the insulation layer of the SOI substrate and a trench isolation, it is possible, for example, to make contact with the channel region via the conductive layer, thereby avoiding the disadvantages known from SOI transistors, such as charge accumulation in the channel region.

Other features which are considered as characteristic for the invention are set forth in the appended claims.

Although the invention is illustrated and described herein as embodied in a semiconductor memory having a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
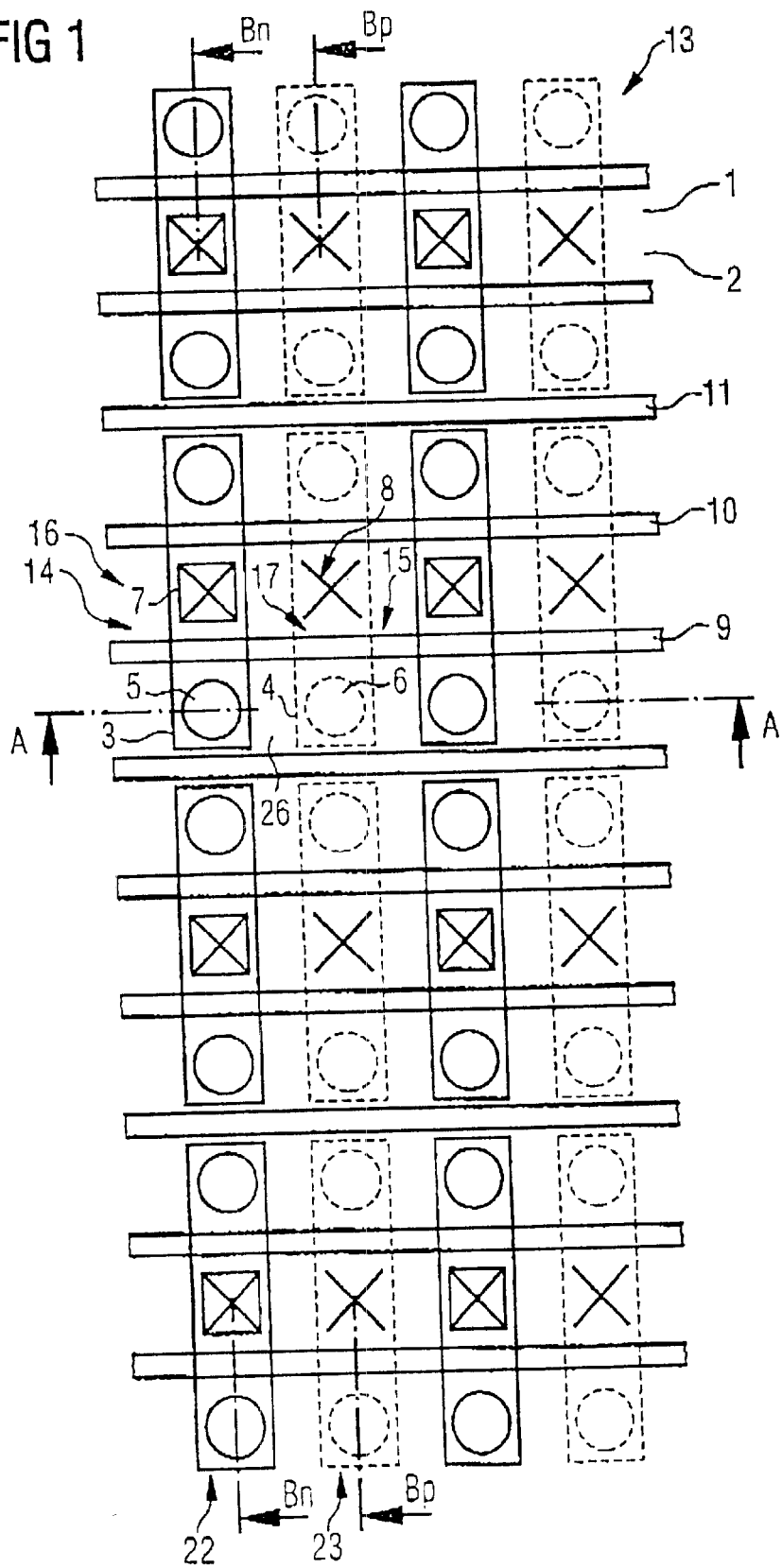
FIG. 1 shows a plan view of a configuration of memory cells including selection transistors and storage capacitors, with p- and n-channel transistors being formed.

Referring now to the figures of the drawing in detail and first, particularly, to FIG. 1 thereof, there is shown a plan view of a memory cell array 13. The memory cell array 13 is formed on a substrate 1. This is, for example, an SOI substrate (silicon on insulator) which has a buried insulation layer 12 (See FIG. 2). An active n-channel region 3 and an active p-channel region 4 are formed in the substrate 1. The active n-channel region 3 is weakly p-doped, for example, and the active p-channel region is weakly n-doped. A first word line 9 and a second word line 10 run over the active n-channel region 3 and the active p-channel region 4. The active n-channel region 3 and the active p-channel region 4 are insulated from one another by a trench isolation 26. A first memory cell 14 including a first selection transistor 16 and a first storage capacitor 18 is formed in the active n-channel region. Also illustrated are a first bit line contact 7 and an n-channel capacitor connection 5 in the active n-channel region 3. A second memory cell 15 having a second selection transistor 17 and a second storage capacitor 19 is configured in the active p-channel region 4. A second bit line connection 8 and a p-channel capacitor connection 6 are likewise illustrated. The first bit line 22 and the second bit line 23 run transversely with respect to the word lines 9, 10, 11. The first bit line 22 runs over adjacent active n-channel regions 3, and the second bit line 23 runs over adjacent active p-channel regions 4. Also illustrated are a section line Bn—Bn through the active n-channel regions 3, a section line Bp—Bp through the active p-channel regions 4 and a section line A—A in the direction in which the word lines 9, 10, 11 run alternately through active n-channel regions and active p-channel regions.

If the memory cell array 13 is formed with stacked capacitors, then the n-channel capacitor connection 5 and the p-channel capacitor connection 6 serve for connecting a stacked capacitor. If the memory cell array 13 is formed with trench capacitors 20, then the trench capacitors 20 may be configured below the n-channel capacitor connection 5 and below the p-channel capacitor connection 6. The memory cell array 13 from FIG. 1 enables a cell size of the memory cells of $6F^2$. By way of example, a sense amplifier is connected to the first bit line 22 and to the second bit line 23. If a first word line voltage is applied to the first word line 9, then it is provided that the first selection transistor 16 and the second selection transistor 17 both turn off, with the result that the first memory cell 14 and the second memory cell 15 retain the information stored in them. If a second word line voltage is then applied to the first word line 9, then it is provided that the first selection transistor 16 opens and the charge stored in the first memory cell 14 flows onto the first bit line 22. The sense amplifier then compares the voltage on the first bit line 22 and the second bit line 23, the second bit line 23 serving as a reference bit line for this read operation.

However, if a third word line voltage is applied to the first word line 9, then it is provided that the second selection transistor 17 opens and the charge stored in the second storage capacitor 19 flows onto the second bit line 23, in this case the sense amplifier utilizing the first bit line 22 as a reference bit line in order to evaluate the charge signal on the second bit line 23.

Figure 2:
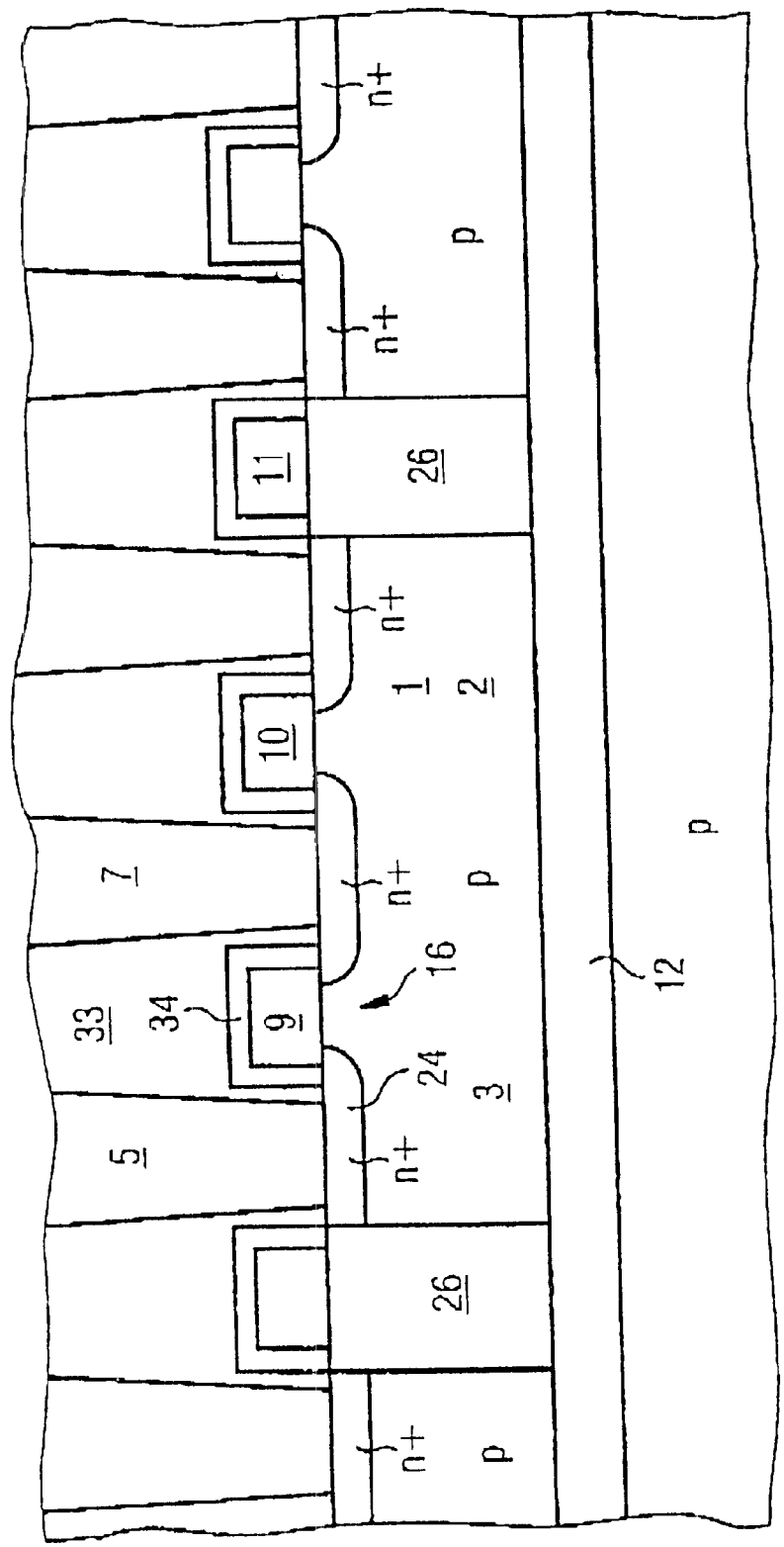
FIG. 2 shows a sectional diagram along the section line Bn—Bn shown FIG. 1 with the memory cells constructed for stacked capacitors.

On the basis of FIG. 1, a variant with stacked capacitors 21 is illustrated in FIGS. 2 to 6. A sectional diagram along the section line Bn—Bn from FIG. 1 is illustrated in FIG. 2. A first selection transistor 16 is configured in the substrate 1, which is an SOI substrate 2 having an insulation layer 12. The first selection transistor 16 has a first source doping region 24 and a first word line 9. The first word line 9 is surrounded with an insulating word line sheath 34. Furthermore, the first selection transistor 16 is connected to an n-channel capacitor connection 5 and to a first bit line connection 7. A second word line 10 and a third word line 11 are configured beside the first word line 9. The first word line 9 and the second word line 10 run above an active n-channel region 3, and the third word line 11 runs above a trench isolation 26. In this exemplary embodiment the active n-channel region 3 is enclosed by the trench isolation 26. In this embodiment, it is provided that the trench isolation 26 is composed of silicon oxide. The active n-channel region 3 is composed of p-doped silicon. The first source doping region 24 is composed of highly n-doped silicon, and an insulation layer 33 is composed of BPSG (Boro Phosphos Silicate Glass).

Figure 3:
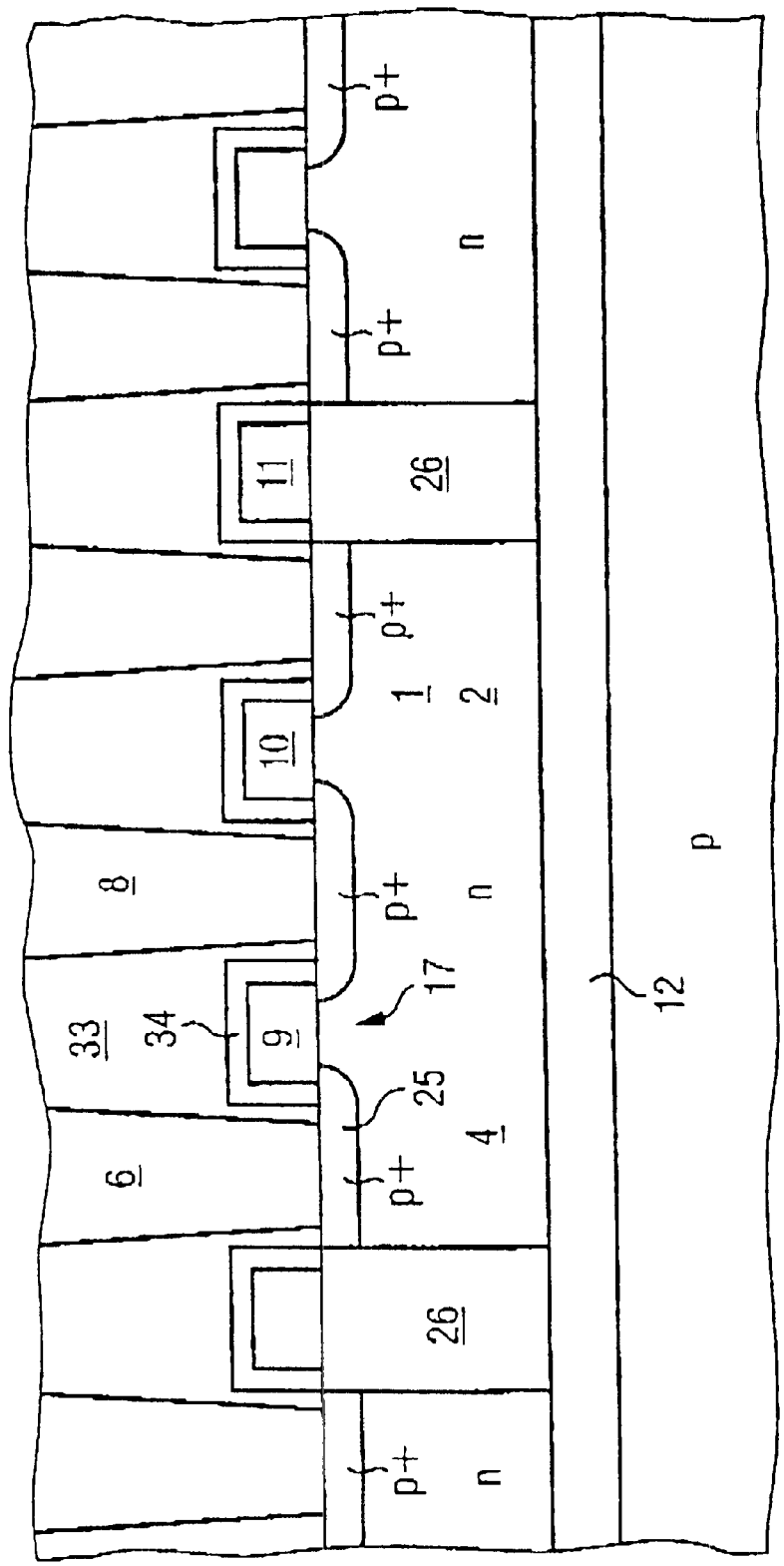
FIG. 3 shows a sectional diagram along the section line Bp—Bp shown in FIG. 1 with the memory cells constructed for stacked capacitors.

A sectional diagram along the section line Bp—Bp from FIG. 1 is illustrated in FIG. 3. The structure of the configuration illustrated in FIG. 3 is equivalent to the structure illustrated in FIG. 2, although some dopings are interchanged since in this case an active p-channel region 4 is used for the p-channel transistors. The substrate 1 is again an SOI substrate 2, and a second selection transistor 17 is formed in an active p-channel region 4. The second selection transistor 17 is likewise connected to the first word line 9, and furthermore has a second, highly n-doped source doping region 25. The second source doping region 25 is connected to a p-channel capacitor connection 6. Furthermore, the second selection transistor 17 is connected via a second bit line connection 8 to the second bit line 23. The SOI substrate 2 has an insulation layer 12. The active p-channel region 4 is insulated by the trench isolation 26. In this exemplary embodiment, the first word line 9 and the second word line 10 run above the active p-channel region 4. The third word line 11 runs above the trench isolation 26.

Figure 4:
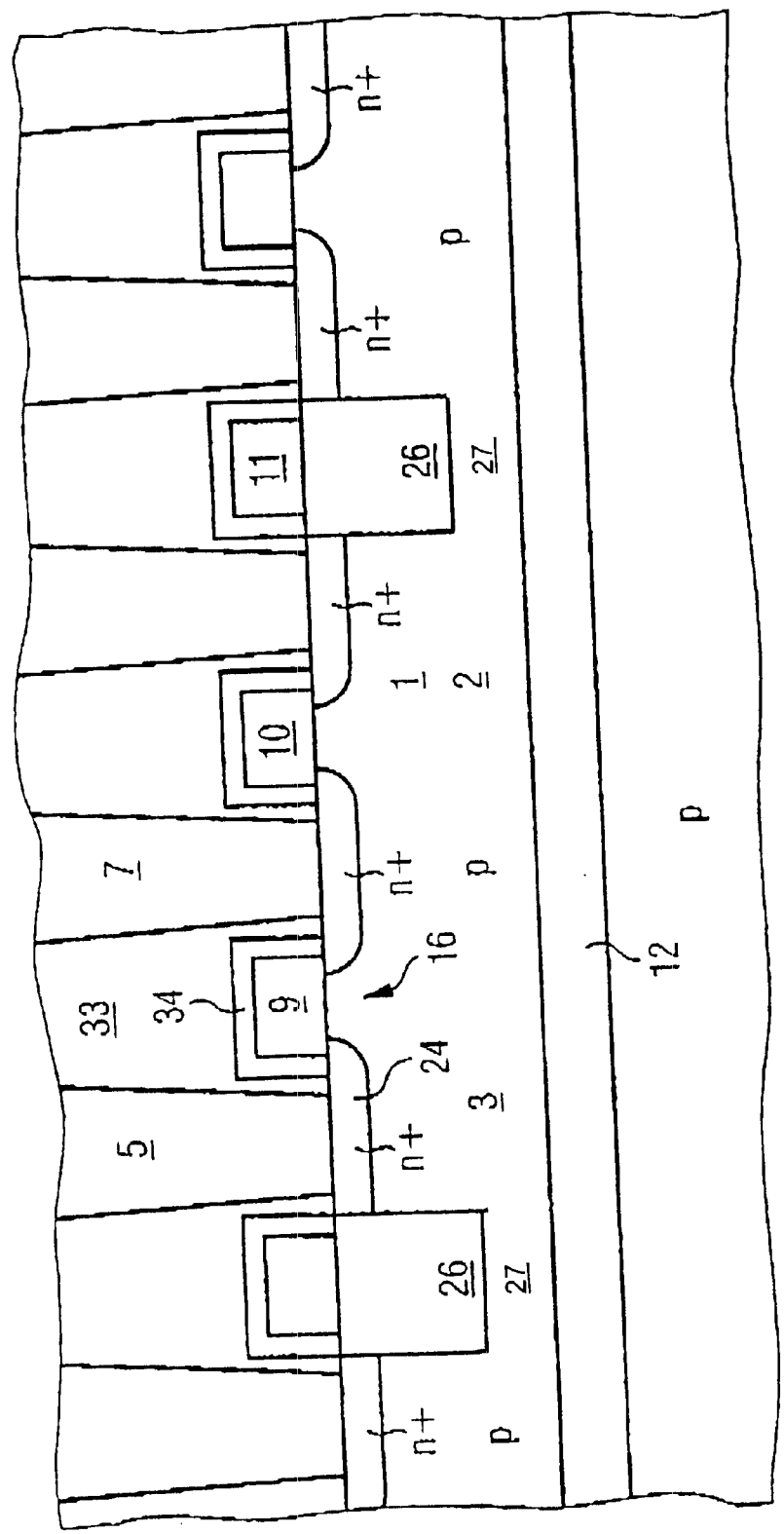
FIG. 4 shows a sectional diagram along the section line Bn—Bn shown FIG. 1, with the STI (Shallow Trench Isolation) not having been formed as far as the insulation layer of the SOI substrate (Silicon on Insulator)

A further sectional diagram along the section line Bn—Bn from FIG. 1 is illustrated in FIG. 4. FIG. 4 differs from FIG. 2 to the effect that the trench isolation 26 does not reach down to the insulating layer 12 since a conductive layer 27 is configured between the trench isolation 26 and the insulation layer 12. The conductive layer 27 has the task of preventing the effects which are typical of SOI transistors, such as substrate charging. In order to prevent this, electrical contact is made with the active n-channel region 3 via the conductive layer 27, with the result that charge carriers which would be accumulated in the substrate can flow away through the conductive layer 27.

Figure 5:
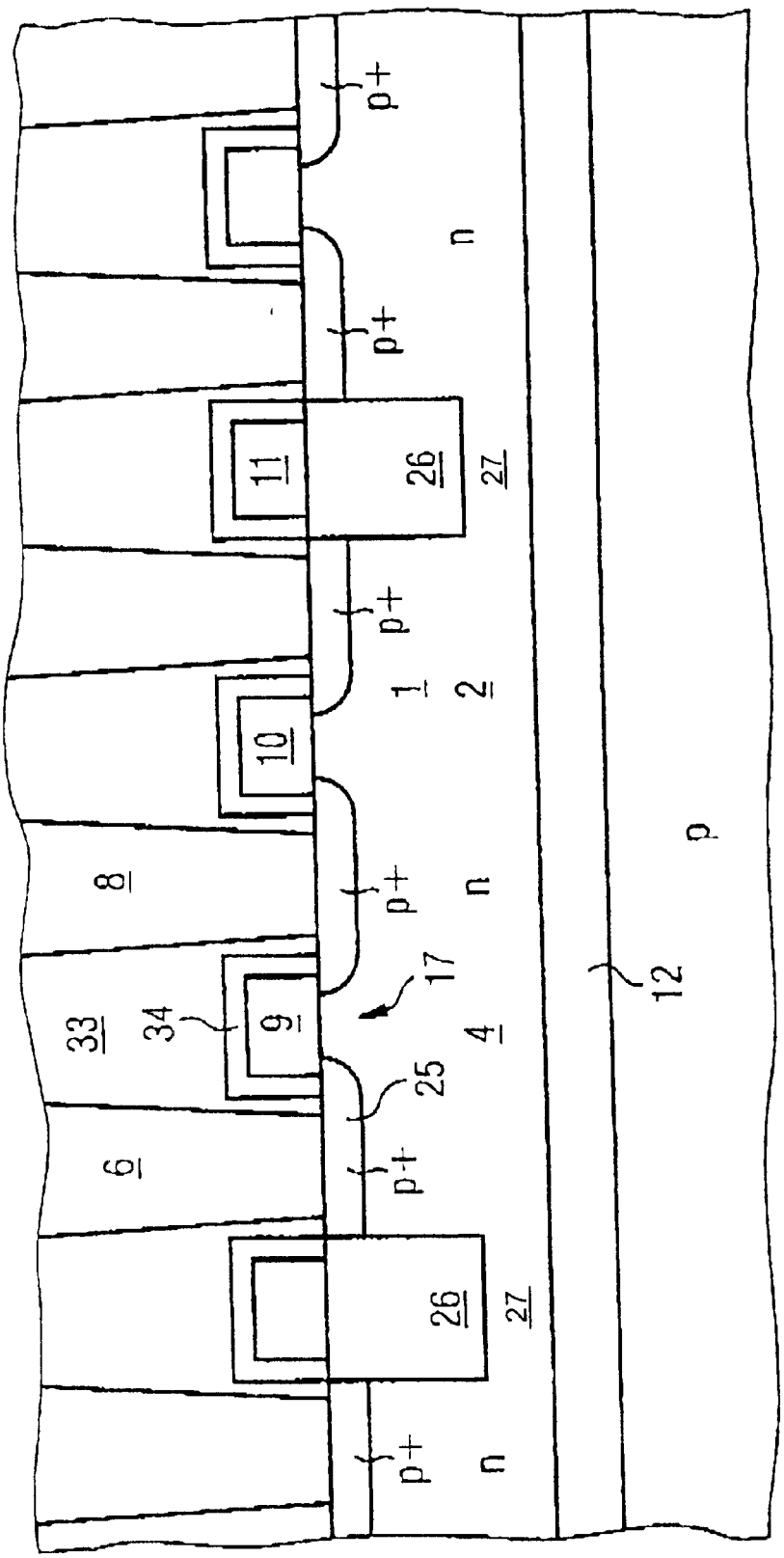
FIG. 5 shows a sectional diagram along the section line Bp—Bp shown in FIG. 1, likewise with raised STI.

A further sectional diagram along the section line Bp—Bp from FIG. 1 is illustrated in FIG. 5. The difference from FIG. 3 is that SOI effects are likewise avoided for the p-channel transistors formed in the active p-channel region 4. This is done in this case, too, by the isolation trench 26 not reaching down to the insulation layer 12, rather a conductive layer 27 is configured between the isolation trench 26 and the insulating layer 12.

Figure 6:
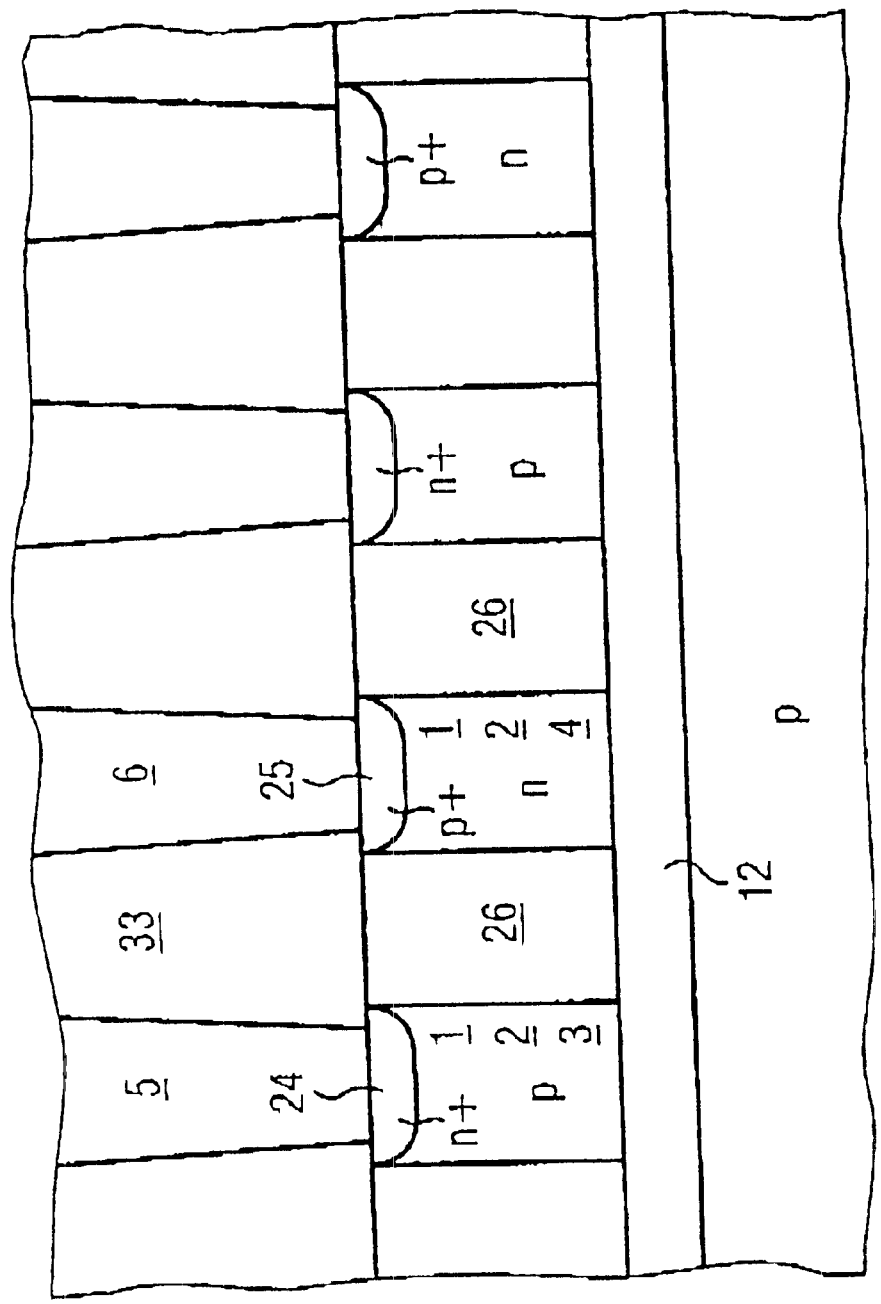
FIG. 6 shows a sectional diagram along the section plane A—A shown in FIG. 1.

A sectional diagram along the section line A—A from FIG. 1 is illustrated in FIG. 6. The insulation layer 12 is configured in the substrate 1, which is designed as an SOI substrate 2. Active n-channel regions 3 and active p-channel regions 4 are configured alternately above the insulation layer 12 and are insulated from one another by a trench isolation 26. By way of example, the first source doping region 24 is configured in the active n-channel region 3 and is connected via the n-channel capacitor connection 5 to the first capacitor 18 which is designed as a stacked capacitor. The trench isolation 26 is configured beside the active n-channel region 3, and the active p-channel region 4 is configured on the other side of the trench isolation 26. The second source doping region 25 is configured in the upper region in the active p-channel region 4 and is connected via the p-channel capacitor connection 6 to the second storage capacitor 19, which is likewise designed as a stacked capacitor.

Figure 7:
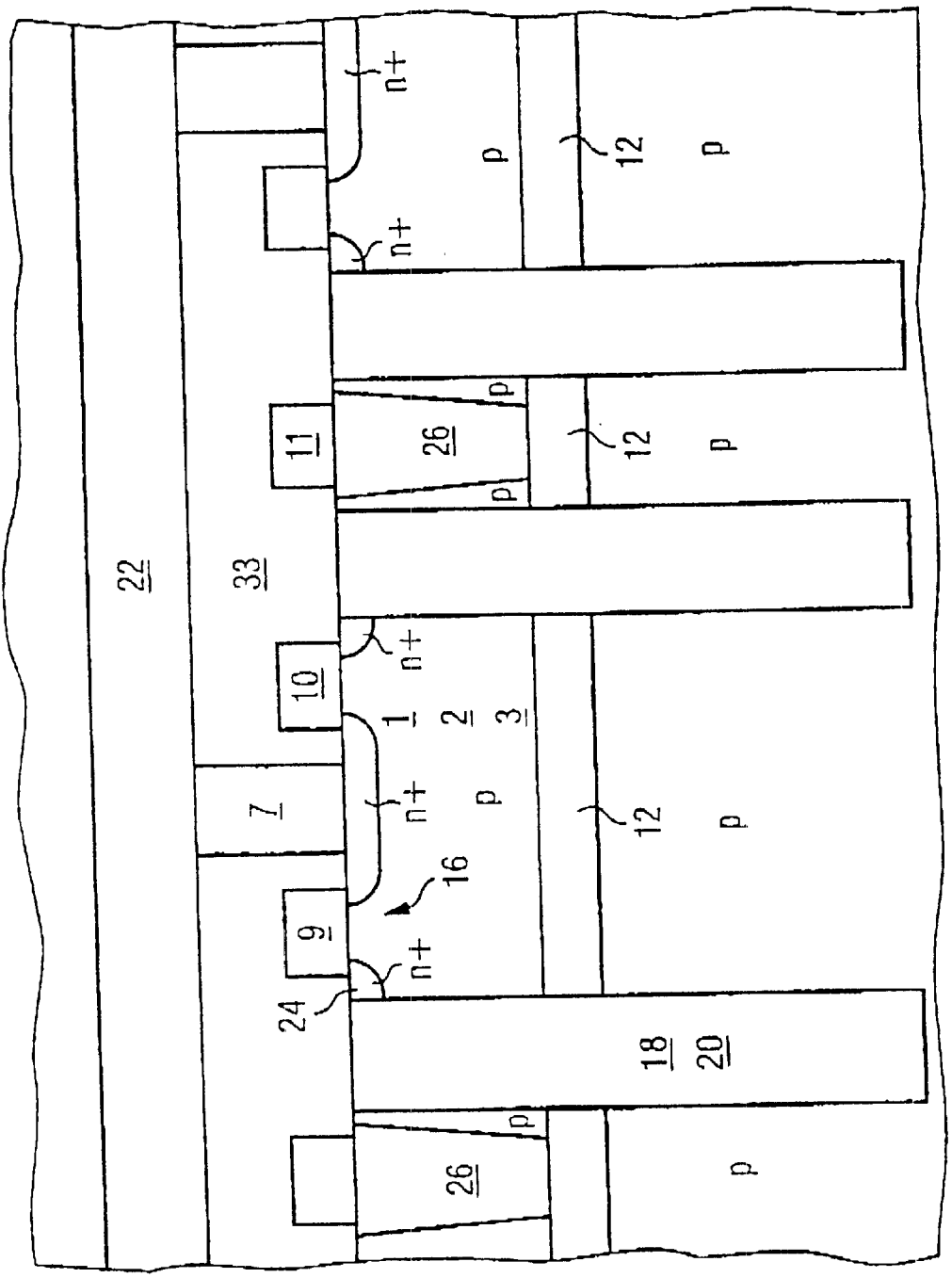
FIG. 7 shows a sectional diagram along the section line Bn—Bn shown in FIG. 1 with trench capacitors.

A variant with trench capacitors with respect to the memory cell array 13 illustrated in FIG. 1 is described in FIGS. 7 to 11. In FIG. 7, the substrate 1, which is formed as an SOI substrate 2, is likewise provided with the insulation layer 12. The trench capacitors 20 project through the insulation layer 12. By way of example, a first selection transistor 16 is configured in the active n-channel region 3. The transistor has a first source doping region 24. The first source doping region 24 is connected, for example, to the first storage capacitor 18, which is designed as a trench capacitor 20. Furthermore, the first selection transistor 16 is connected via the first bit line connection 7 to the first bit line 22. A second word line 10 and a third word line 11 run beside the first word line 9, which controls the first selection transistor 16. The second word line 10 likewise runs above the active n-channel region 3, and the third word line 11 runs above a trench isolation 26. An insulation layer 33, which is formed from a BPSG, for example, serves for planarizing the surface.

Figure 8:
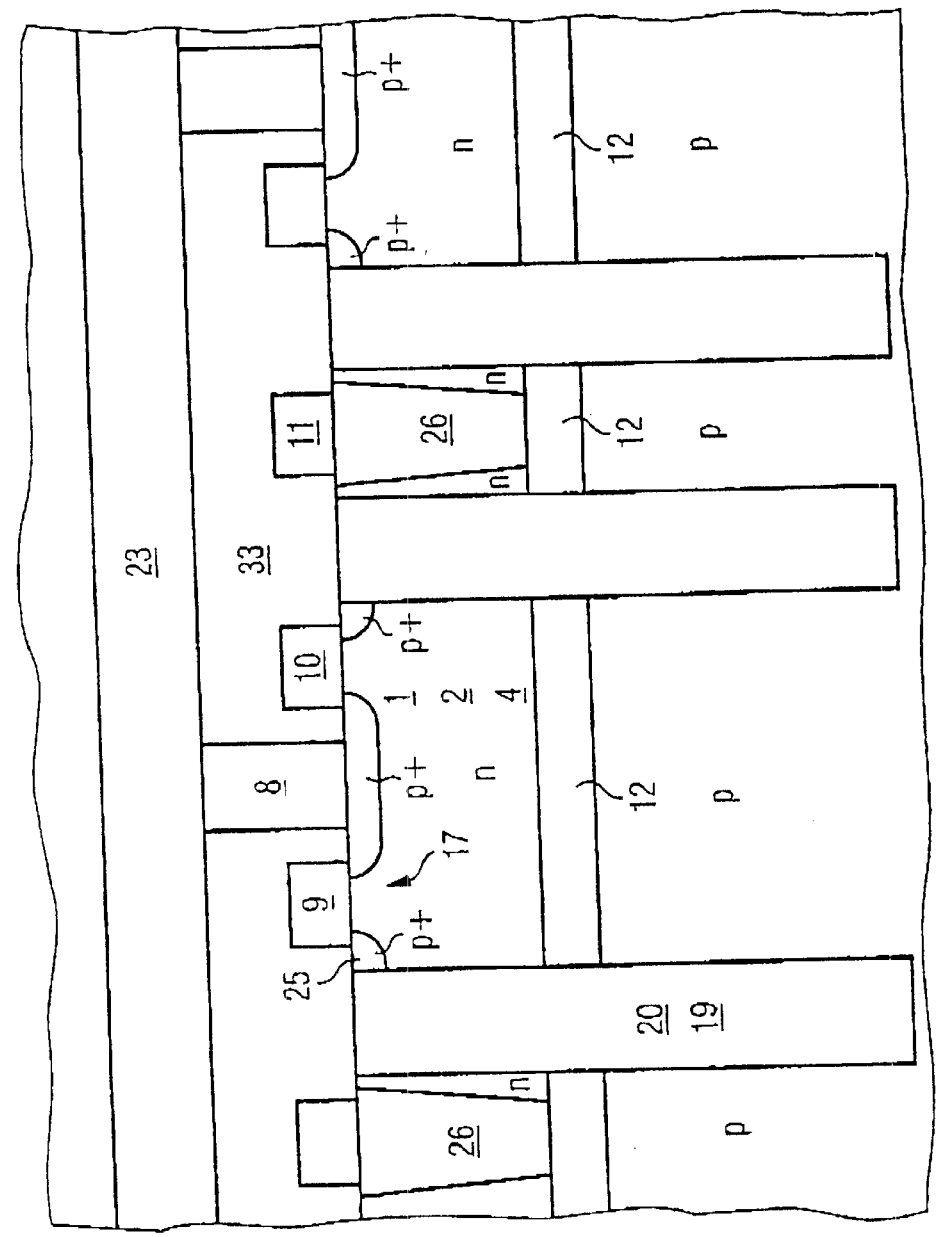
FIG. 8 shows a sectional diagram along the section line Bp—Bp shown in FIG. 1 with trench capacitors.

A sectional diagram along the section line Bp—Bp from FIG. 1 is illustrated in FIG. 8. The configuration is formed in the substrate 1, which is an SOI substrate 2. In this case, too, the trench capacitors 20 extend through the insulation layer 12. Above the insulation layer 12, there is an active p-channel region 4, in which a second selection transistor 17 is formed. The second selection transistor 17 has a second source doping region 25 connected to a second storage capacitor 19, which is designed as a trench capacitor 20. The second selection transistor 17 is controlled by means of the first word line 9. Furthermore, the second selection transistor 17 is connected via the second bit line connection 8 to the second bit line 23. An insulation layer 33 made of BPSG is configured between the bit line 23 and the selection transistors 16, 17. In this exemplary embodiment, adjacent memory cells are insulated from one another by the trench isolation 26.

Figure 9:
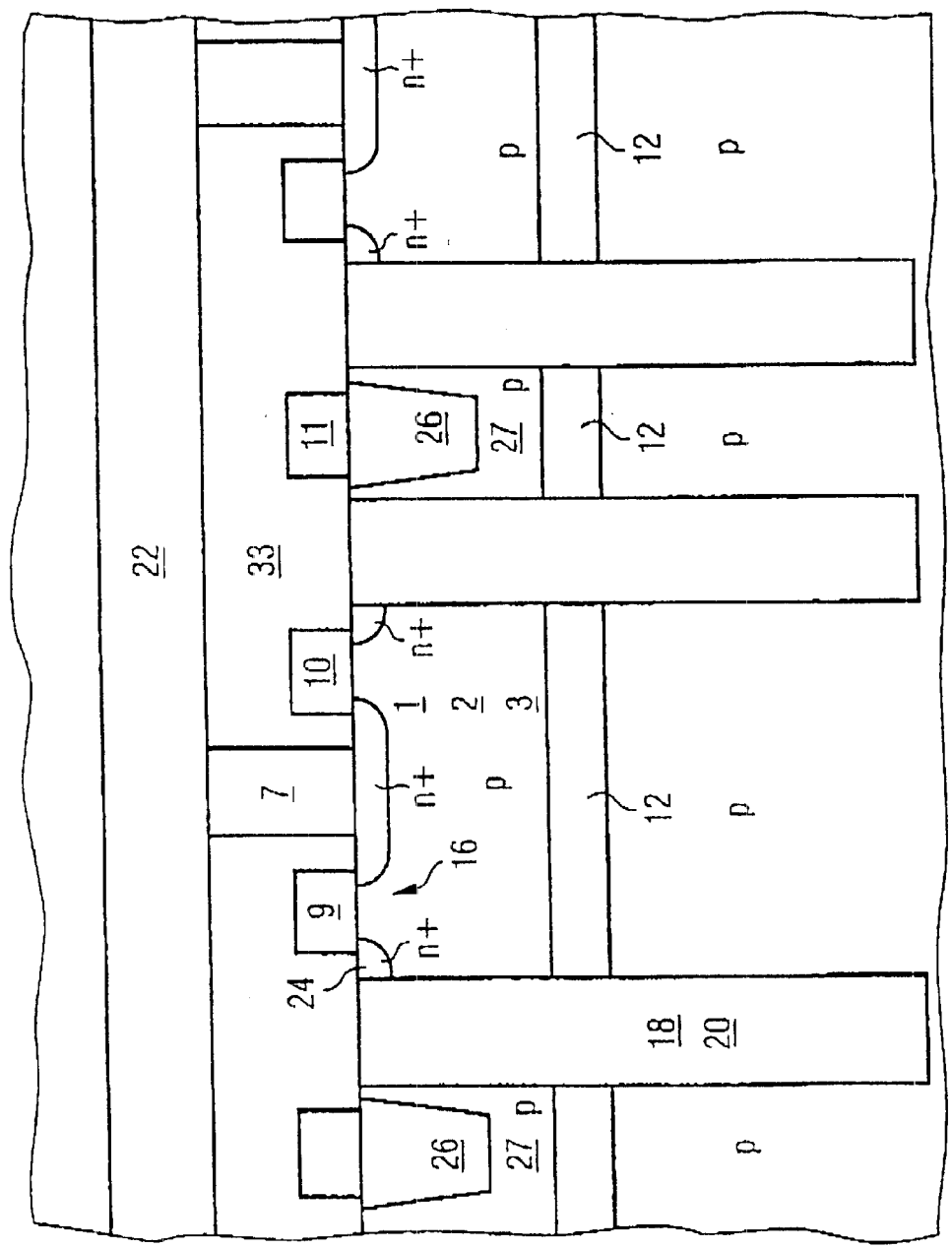
FIG. 9 shows a sectional diagram along the section line Bn—Bn shown in FIG. 1 with trench capacitors and raised STI.

A further sectional diagram along the section line Bn—Bn from FIG. 1 is illustrated in FIG. 9. FIG. 9 differs from FIG. 7 to the effect that the trench isolation 26 does not reach as far as the insulation layer 12, rather a conductive layer 27 is configured between the trench isolation 26 and the insulation layer 12. This has the advantage that SOI effects of the selection transistors are avoided since the charge which would usually accumulate in the substrate can be transported away.

Figure 10:
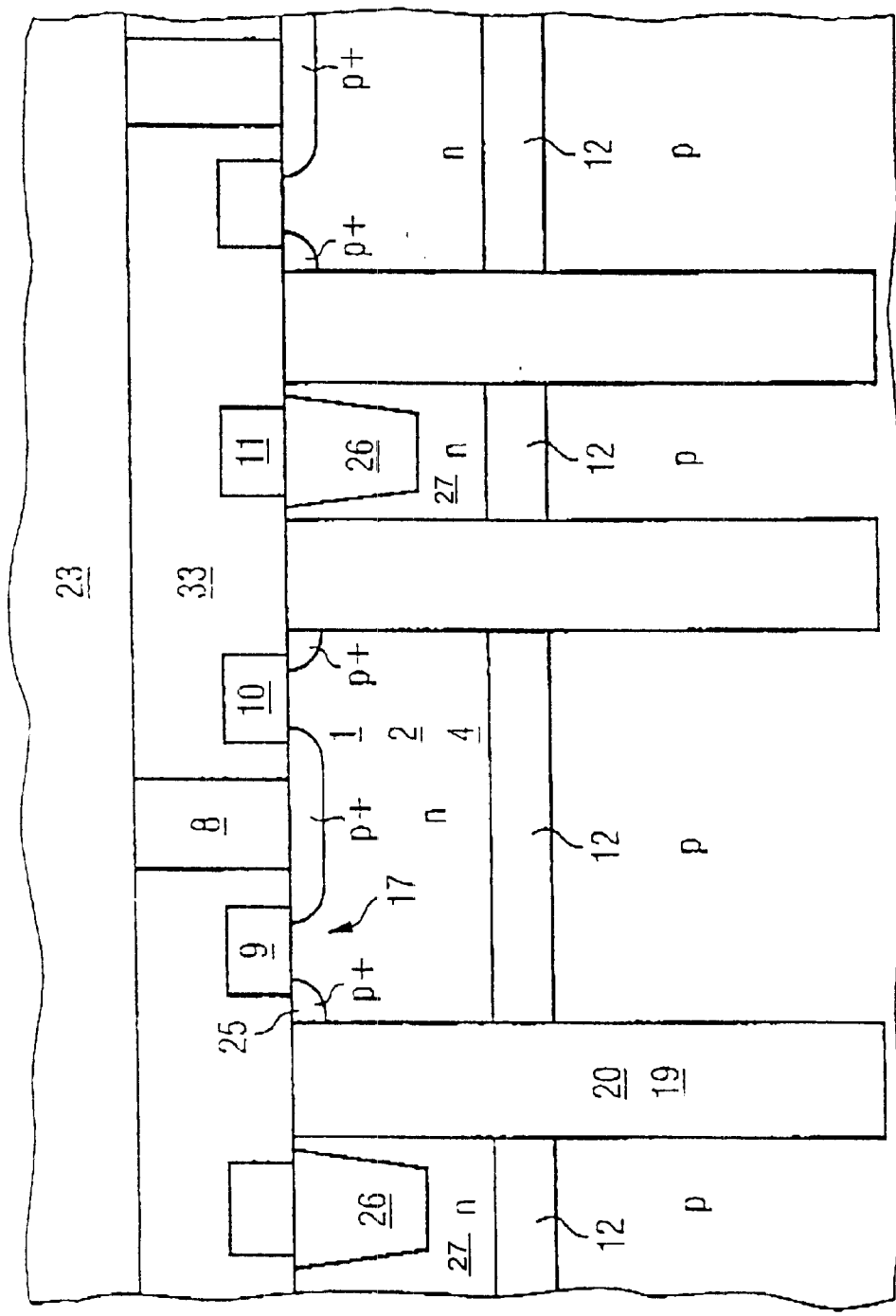
FIG. 10 shows a sectional diagram along the section line Bp—Bp shown in FIG. 1 with trench capacitors and raised STI.

A further sectional diagram along the section line Bp—Bp from FIG. 1 is illustrated in FIG. 10. FIG. 10 differs from FIG. 8 to the effect that the trench isolation 26 does not reach as far as the insulation layer 12, rather a conductive layer 27 is configured between the trench isolation 26 and the insulation layer 12. This has the advantage that SOI effects of the selection transistors are avoided since the charge which would usually accumulate in the substrate can be transported away.

Figure 11:
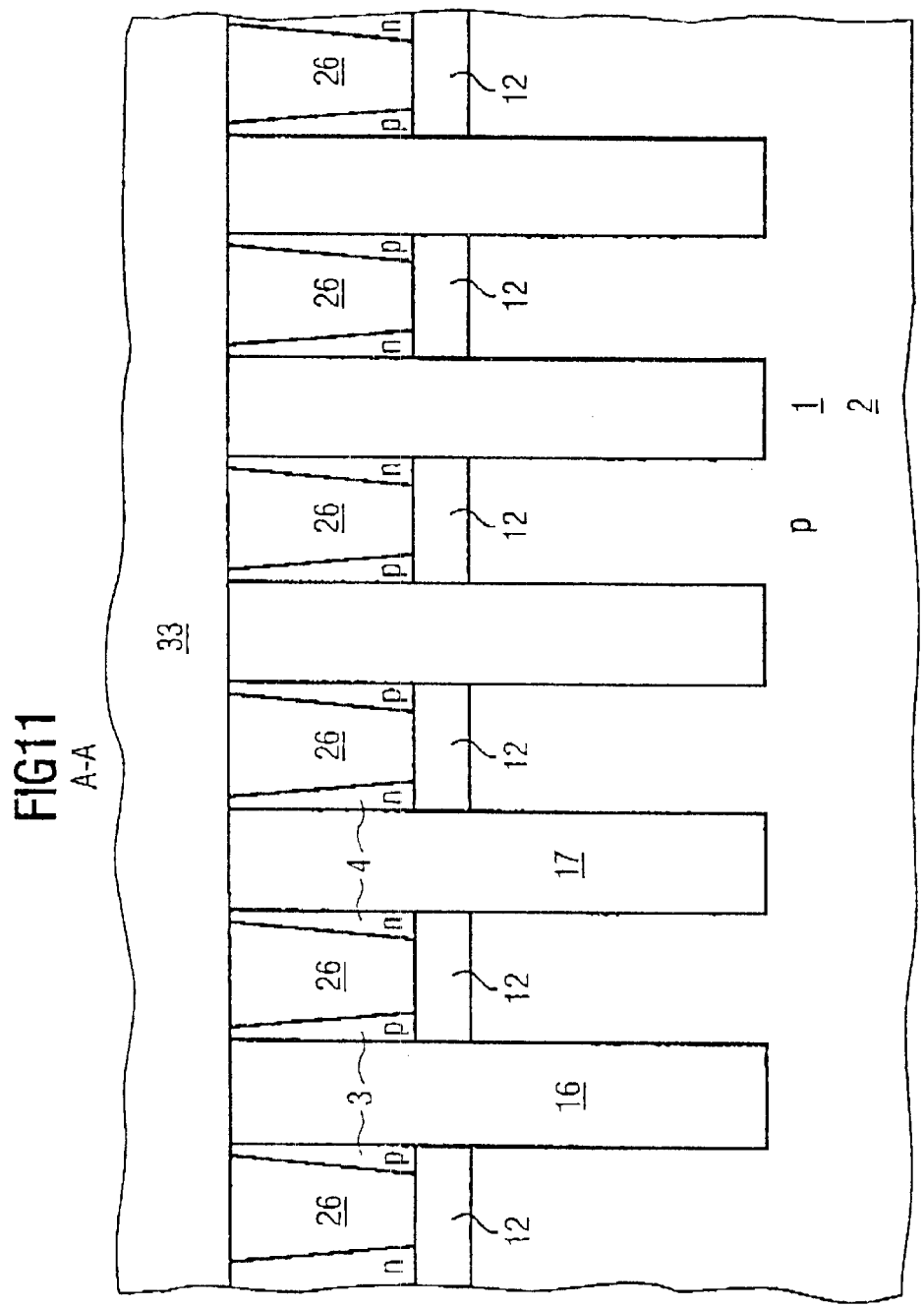
FIG. 11 shows a sectional diagram along the section line A—A shown in FIG. 1 with trench capacitors.

A sectional diagram along the section line A—A from FIG. 1 is illustrated in FIG. 11. The substrate 1 is again an SOI substrate having an insulation layer 12. The first storage capacitor 18 and the second storage capacitor 19 are designed as trench capacitors 20 and extend through the insulation layer 12. Above the insulation layer 12, the individual trench capacitors and the active channel regions 3, 4 surrounding them are insulated from one another by a trench isolation 26. In this case, the active n-channel region 3 is formed around the first storage capacitor 18 and the active p-channel region 4 is formed around the second storage capacitor 19. An insulation layer 33 made of BPSG is configured above the trench capacitors 20 and the isolation trench 26.

Figure 12:
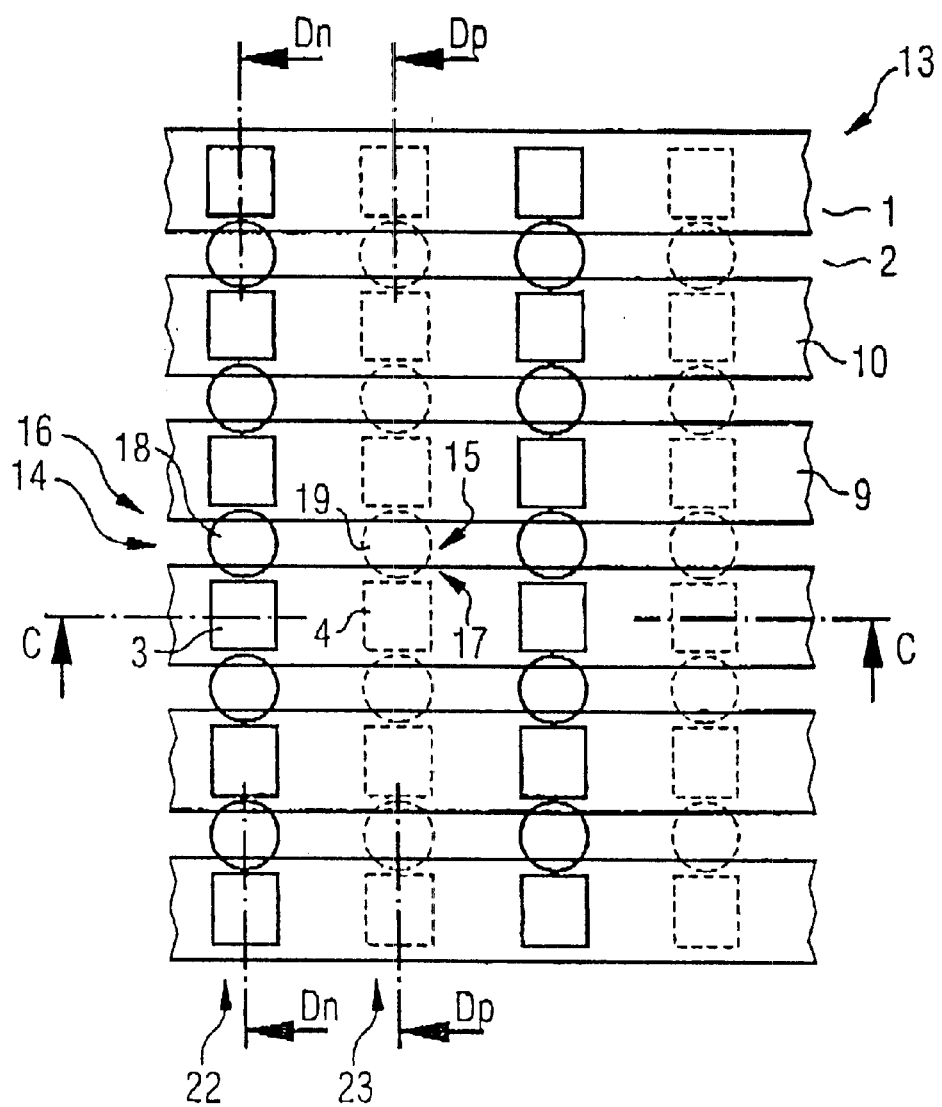
FIG. 12 shows a plan view of a configuration of memory cells including selection transistors and storage capacitors, the selection transistors being designed as n-channel transistors and p-channel transistors.

A further memory cell array 13 is illustrated in FIG. 12. This memory cell array enables a memory cell size of $4F^2$. The substrate 1 is an SOI substrate 2, for example. An active n-channel region 3 and an active p-channel region 4 are configured in the SOI substrate 2. The active n-channel region 3 and the active p-channel region 4 are surrounded by a spacer word line (lateral edge web). A first memory cell 14 having a first selection transistor 16 and a first storage capacitor 18 is formed in connection with the active n-channel region 3. A second memory cell 15 including a second selection transistor 17 and a second storage capacitor 19 is formed in connection with the active p-channel region 4. The first memory cell 14 is connected to a first bit line 22, and the second memory cell 15 is connected to a second bit line 23. Furthermore, adjacent memory cells with an active n-channel region are connected to the first bit line 22. Further, adjacent memory cells with an active p-channel region are connected to the second bit line 23. A second word line 10 is configured beside the first word line 9. Sectional diagrams are illustrated along the section lines Dn—Dn, Dp—Dp, and C—C in FIGS. 14 to 16.

Figure 13:
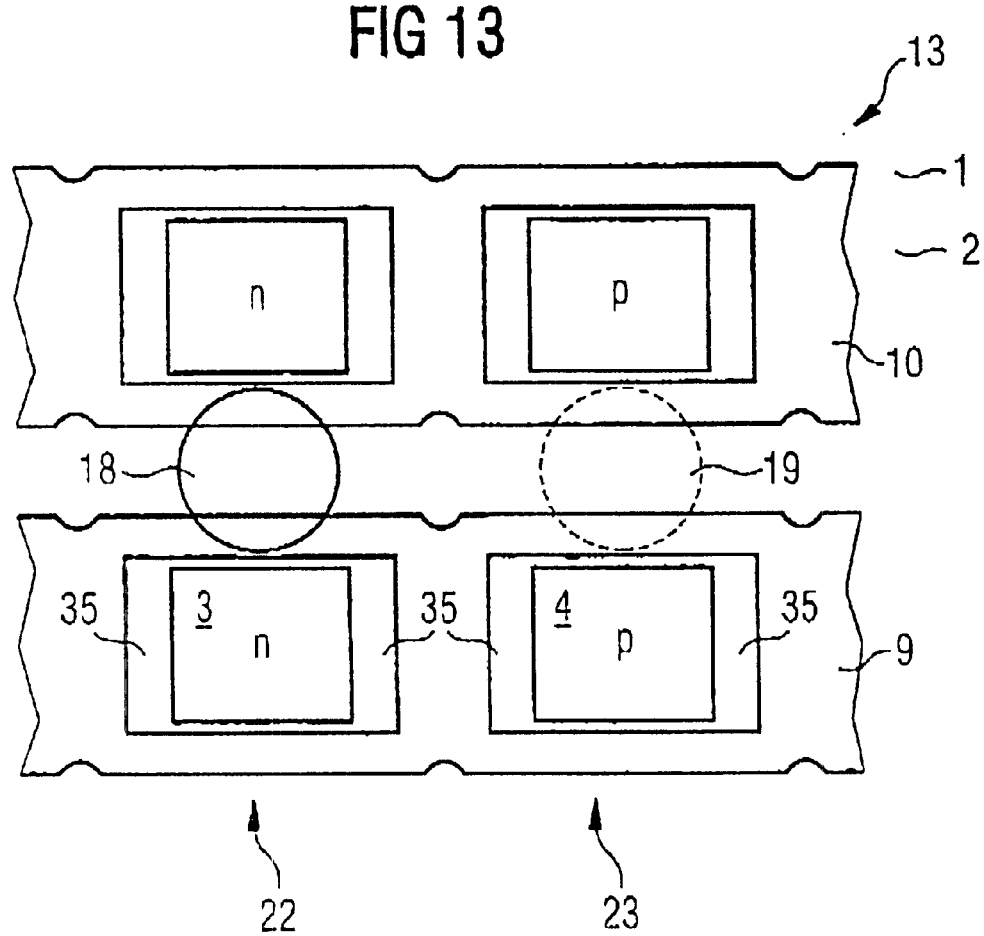
FIG. 13 shows a plan view of an enlarged region from FIG. 12 and in which the course of the word lines has been enlarged.

An enlarged plan view of the memory cell array 13 illustrated in FIG. 12 is represented in FIG. 13. An active n-channel region 3 and an active p-channel region 4 are configured in the substrate 1, which is formed as an SOI substrate 2. In this exemplary embodiment, the active n-channel and p-channel regions 3, 4 are configured on both sides with the period of the smallest feature size F. The first word line 9 is formed as a spacer word line around the active n-channel region 3 and the active p-channel region 4. The second word line 10 is configured adjacent to the first word line 9. Lateral insulation edge webs 35 are formed on the active channel regions 3, 4, transversely with respect to the course of the first word line 9.

Figure 14:
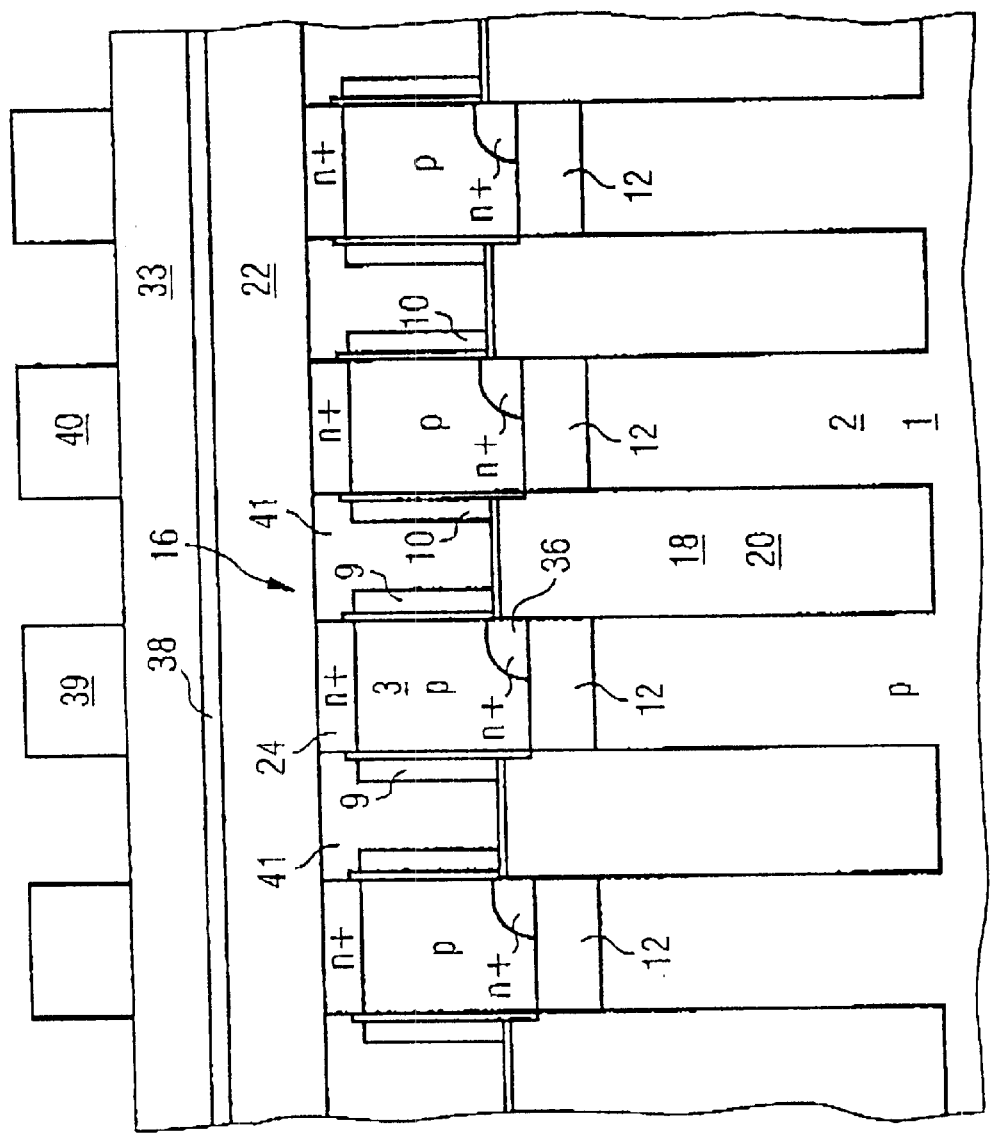
FIG. 14 shows a sectional diagram along the section line Dn—Dn shown in FIG. 12 with trench capacitors.

A sectional diagram along the section line Dn—Dn from FIG. 12 is illustrated in FIG. 14. An insulation layer 12 is configured in the substrate 1 since the substrate is designed as an SOI substrate 2. Above the insulation layer 12 there is an active n-channel region 3, in which the first selection transistor 16 is formed as a vertical transistor. In this case, the first selection transistor 16 has a first source doping region 24 and a first drain doping region 36. The first drain doping region 36 is connected to the first storage capacitor 18, which is designed as a trench capacitor 20. The first word line 9 runs beside the active n-channel region 3 and is insulated by a gate oxide. Adjacent to the active n-channel region 3 there is a further active n-channel region surrounded by the second word line 10. The first source doping region 24 is connected to the first bit line 22. Adjacent word lines are insulated from one another by the insulation 41. The first bit line 22 is insulated by a bit line insulation sheath 38. An insulation layer 33 is configured above the bit line insulation sheath 38. A first metal word line 39 and a second metal word line 40 run above the insulation layer 33 and are connected to the first word line 9 and the second word line 10 in order that the word lines 9, 10 formed as spacers are configured with a lower impedance.

Figure 15:
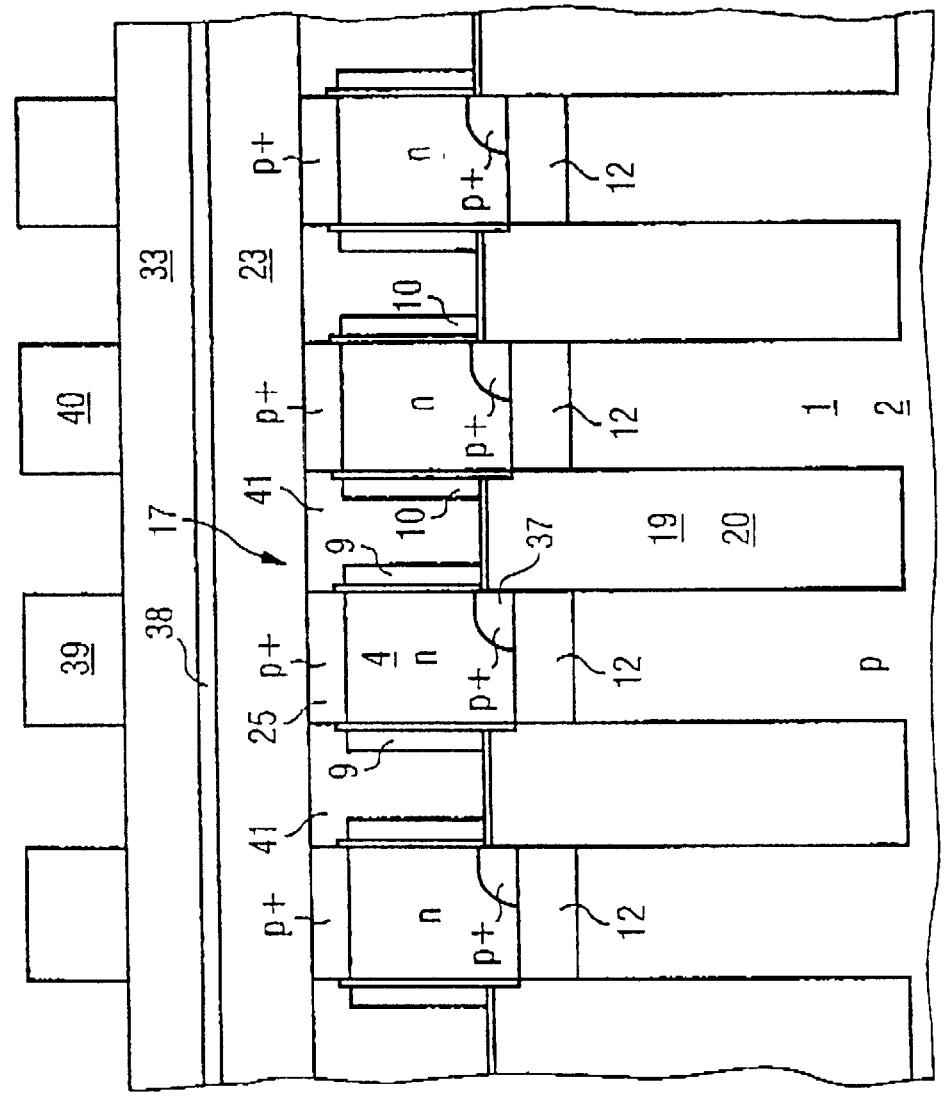
FIG. 15 shows a sectional diagram along the section line Dp—Dp shown in FIG. 12 with trench capacitors.

A sectional diagram along the section line Dp—Dp from FIG. 12 is illustrated in FIG. 15. FIG. 15 corresponds to the structure illustrated in FIG. 14 except for the doping, which has been inverted for the formation of p-channel transistors. The insulation layer 12 is configured in the substrate 1, with the result that the substrate 1 is designed as an SOI substrate 2. The active p-channel region 4 is configured above the insulation layer 12, the second selection transistor 17 being formed in the channel region. The second selection transistor 17 has a second source doping region 25 and a second drain doping region 37 connected to the second storage capacitor 19, which is likewise designed as a trench capacitor 20. The second source doping region 25 is connected to a second bit line 23. The active p-channel region 4 is insulated from the first word line 9, which also controls the second selection transistor 17, by a gate oxide. The second word line 10, which in this case likewise surrounds an active p-channel region, runs adjacent to the first word line 9. Configured above the second bit line 23 is a bit line insulation sheath 38, on which the insulation layer 33 runs. The first metal word line 39 and the second metal word line 40 are configured above the insulation layer 33 and are connected to the first word line 9 and the second word line 10 in order to form the latter with a lower impedance.

Figure 16:
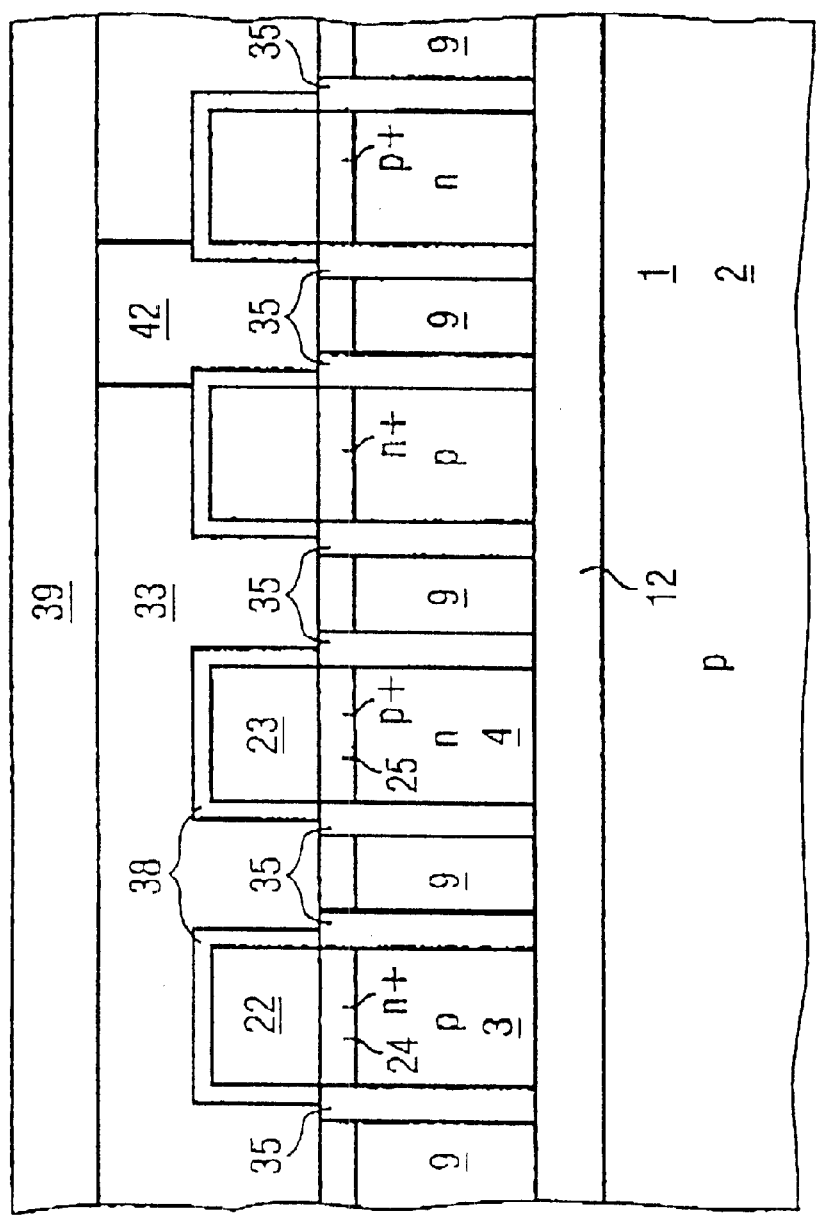
FIG. 16 shows a sectional diagram along the section line C—C shown in FIG. 12.

A sectional diagram along the section line C—C from FIG. 12 is illustrated in FIG. 16. The SOI substrate 2 has an insulation layer 12 on which active n-channel region 3 and active p-channel region 4 are alternately configured. The active n-channel region 3 and the active p-channel region 4 are insulated by lateral insulation edge webs 35 (spacers). Furthermore, the first word line 9 runs beside the active n-channel region 3 and the active p-channel region 4. The first source doping region 24 is connected to the first bit line 22 and the second source doping region 25 is connected to the second bit line 23. The first bit line 22 and the second bit line 23 are surrounded by a bit line insulation sheath 38. An insulation layer 33 made of BPSG is configured above the bit lines for planarization purposes. A metallic word line contact 42 is provided through the insulation layer 33. The metallic word line contact 42 connects the first metal word line 39 running above the insulation layer 33 to the first word line 9.

The substrate is usually formed from silicon. The SOI substrate used in this case also includes silicon but has a buried insulation layer 12 in the substrate 1. The active n-channel region is, for example, a weakly p-doped silicon, and the active p-channel region is a weakly n-doped silicon.

I claim:

1. A semiconductor memory having a memory cell array, the memory cell array comprising:
    a silicon on insulator substrate having an insulation layer;
    a first memory cell having a first storage capacitor and a first selection transistor formed as an n-channel transistor;
    a second memory cell having a second storage capacitor and a second selection transistor formed as a p-channel transistor;
    said first memory cell and said second memory cell formed in said silicon on insulator substrate;
    a word line connected to said first and second selection transistors; and
    a trench isolation formed in said substrate;
    said trench isolation together with said insulation layer insulating said first selection transistor from said second selection transistor.

2. The semiconductor memory according to claim 1, wherein at least one of said first storage capacitor and said second storage capacitor is formed as a trench capacitor.

3. The semiconductor memory according to claim 1, wherein at least one of said first storage capacitor and said second storage capacitor is formed as a stacked capacitor.

4. The semiconductor memory according to claim 1, wherein said first selection transistor is formed as a vertical transistor.

5. The semiconductor memory according to claim 1, wherein said second selection transistor is formed as a vertical transistor.

6. The semiconductor memory according to claim 4, comprising:
    a trench isolation formed in said substrate for insulating said first selection transistor from said second selection transistor; and
    a conductive layer configured between said trench isolation and said insulation layer.

7. The semiconductor memory according to claim 1, wherein:
    said second selection transistor has a threshold voltage; and
    said first selection transistor includes a gate made of a mid-gap material chosen such that said first selection transistor has a threshold voltage that is a negative value of said threshold voltage of said second selection transistor.

8. The semiconductor memory according to claim 7, comprising germanium provided as a dopant material.

9. The semiconductor memory according to claim 1, wherein:
    said first selection transistor includes a gate material;
    said second selection transistor includes a gate material; and
    at least one of said gate material said first selection transistor and said gate material of said second selection transistor includes polysilicon doped with a dopant.

10. The semiconductor memory according to claim 8, wherein said dopant is germanium.

11. The semiconductor memory according to claim 1, wherein said first selection transistor includes a gate material selected from the group consisting of titanium nitride, tungsten, and tantalum.

12. The semiconductor memory according to claim 1, wherein said second selection transistor includes a gate material selected from the group consisting of titanium nitride, tungsten, and tantalum.

13. The semiconductor memory according to claim 1, comprising:
    a silicide;
    said first selection transistor including a source doping region connected to said first storage capacitor by said silicide.

14. The semiconductor memory according to claim 1, comprising:
    a silicide;
    said second selection transistor including a source doping region connected to said second storage capacitor by said silicide.

* * * * *